United States Patent
Stapelbroek et al.

(10) Patent No.: US 7,202,511 B2
(45) Date of Patent: Apr. 10, 2007

(54) NEAR-INFRARED VISIBLE LIGHT PHOTON COUNTER

(75) Inventors: Maryn G. Stapelbroek, Santa Ana, CA (US); Henry H. Hogue, Tempe, AZ (US); Arvind I. D'Souza, Anaheim, CA (US)

(73) Assignee: DRS Sensors & Targeting Systems, Inc., Anaheim, CA (US)

( * ) Notice: Subject to any disclaimer, the term of this patent is extended or adjusted under 35 U.S.C. 154(b) by 147 days.

(21) Appl. No.: 10/920,537

(22) Filed: Aug. 18, 2004

(65) Prior Publication Data

US 2005/0051858 A1  Mar. 10, 2005

Related U.S. Application Data

(60) Provisional application No. 60/496,856, filed on Aug. 21, 2003.

(51) Int. Cl.
- H01L 29/732 (2006.01)
- H01L 31/0328 (2006.01)
- H01L 31/0336 (2006.01)
- H01L 31/072 (2006.01)
- H01L 31/109 (2006.01)

(52) U.S. Cl. ............ 257/186; 257/10; 257/11; 257/21; 257/53; 257/54; 257/55; 257/56; 257/113; 257/184; 257/185; 257/188; 257/189; 257/225; 257/227; 257/257; 257/258; 257/290; 257/291; 257/414; 257/431; 257/432; 257/461; 257/462; 257/463; 257/464; 257/749

(58) Field of Classification Search ........... 257/10–11, 257/21, 53–56, 113, 184–186, 188, 189, 225, 257/227, 257, 258, 290, 291, 414, 431–432, 257/461–464, 749
See application file for complete search history.

(56) References Cited

U.S. PATENT DOCUMENTS

| | | | |
|---|---|---|---|
| 4,488,165 A * | 12/1984 | Levine | 257/227 |
| 4,533,933 A | 8/1985 | Pellegrini et al. | |
| 4,544,939 A | 10/1985 | Kosonocky et al. | |
| 4,586,068 A * | 4/1986 | Petroff et al. | 257/438 |
| 4,888,521 A | 12/1989 | Tanioka et al. | |
| 4,896,202 A * | 1/1990 | Bharat et al. | 257/439 |
| 4,952,839 A | 8/1990 | Tanioka et al. | |
| 4,962,304 A * | 10/1990 | Stapelbroek et al. | 257/428 |
| 5,012,083 A | 4/1991 | Chu | |
| 5,047,622 A | 9/1991 | Chu | |
| 5,068,524 A | 11/1991 | Elliott et al. | |
| 5,122,669 A | 6/1992 | Herring et al. | |
| 5,163,179 A | 11/1992 | Pellegrini | |
| 5,285,098 A | 2/1994 | Borrello | |
| 5,371,399 A | 12/1994 | Burroughes et al. | |
| 5,525,828 A | 6/1996 | Bassous et al. | |
| 5,648,297 A | 7/1997 | Lin et al. | |
| 5,814,873 A | 9/1998 | Konuma | |
| 5,892,222 A * | 4/1999 | Elabd | 250/226 |

(Continued)

Primary Examiner—Ida M. Soward
(74) Attorney, Agent, or Firm—Sonnenschein Nath & Rosenthal LLP

(57) ABSTRACT

Electromagnetic energy is detected with high efficiency in the spectral range having wavelengths of about 1–2 microns by coupling an absorber layer having high quantum efficiency in the spectral range having wavelengths of about 1–2 microns to an intrinsic semiconducting blocking region of an impurity band semiconducting device included in a solid state photon detector.

5 Claims, 6 Drawing Sheets

U.S. PATENT DOCUMENTS

| | | |
|---|---|---|
| 6,211,560 B1 | 4/2001 | Jimenez et al. |
| 6,444,972 B1 | 9/2002 | Datskos et al. |
| 6,627,914 B1 * | 9/2003 | Komiyama et al. ............ 257/29 |
| 6,720,588 B2 * | 4/2004 | Vickers ........................ 257/186 |
| 6,720,589 B1 * | 4/2004 | Shields ........................ 257/194 |
| 6,812,464 B1 * | 11/2004 | Sobolewski et al. ...... 250/336.2 |
| 6,855,968 B1 * | 2/2005 | Hopper et al. ............... 257/225 |
| 6,921,897 B1 * | 7/2005 | Martin ..................... 250/338.1 |
| 7,057,174 B1 * | 6/2006 | Hopper et al. ............ 250/338.4 |
| 2004/0007671 A1 * | 1/2004 | Sipila et al. ............ 250/370.01 |
| 2004/0245592 A1 * | 12/2004 | Harmon et al. .............. 257/438 |

* cited by examiner

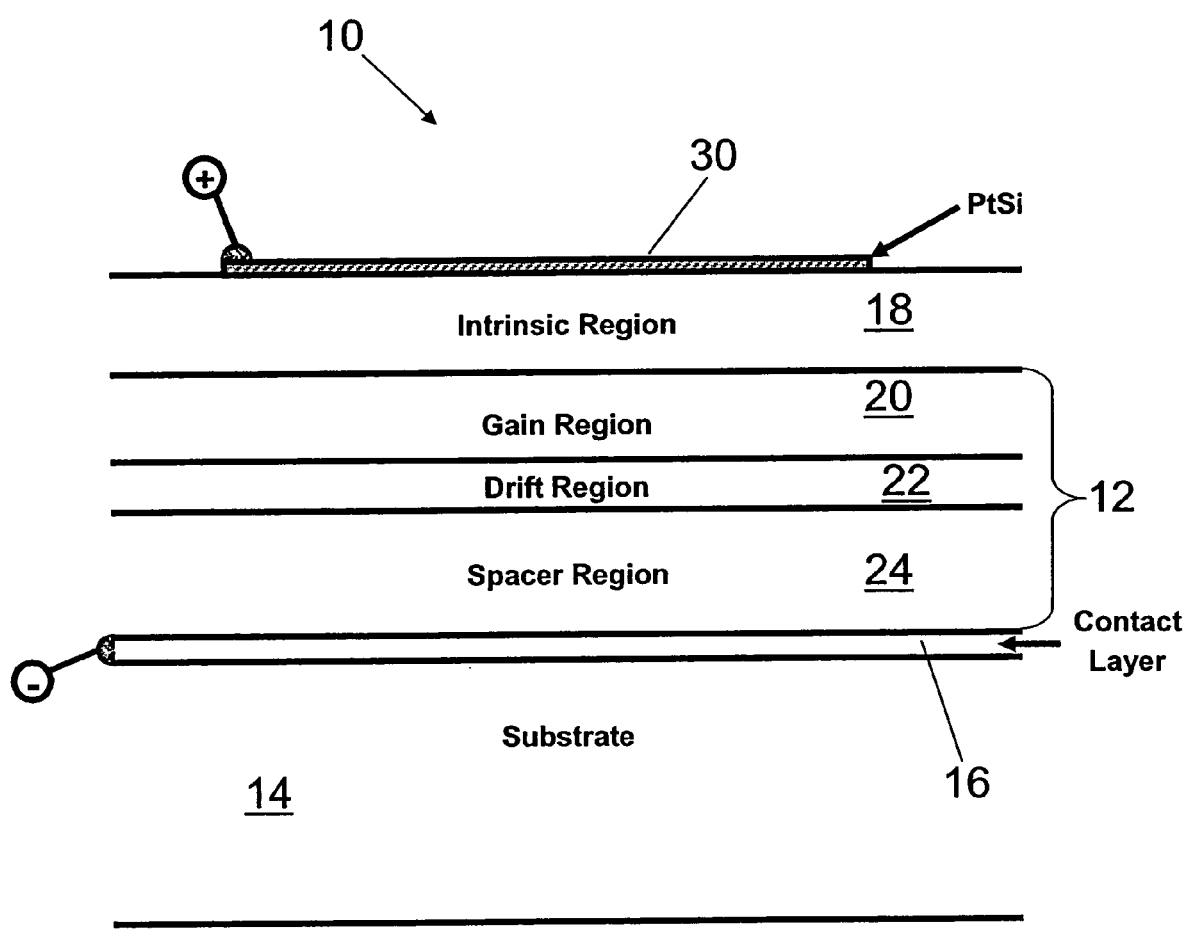

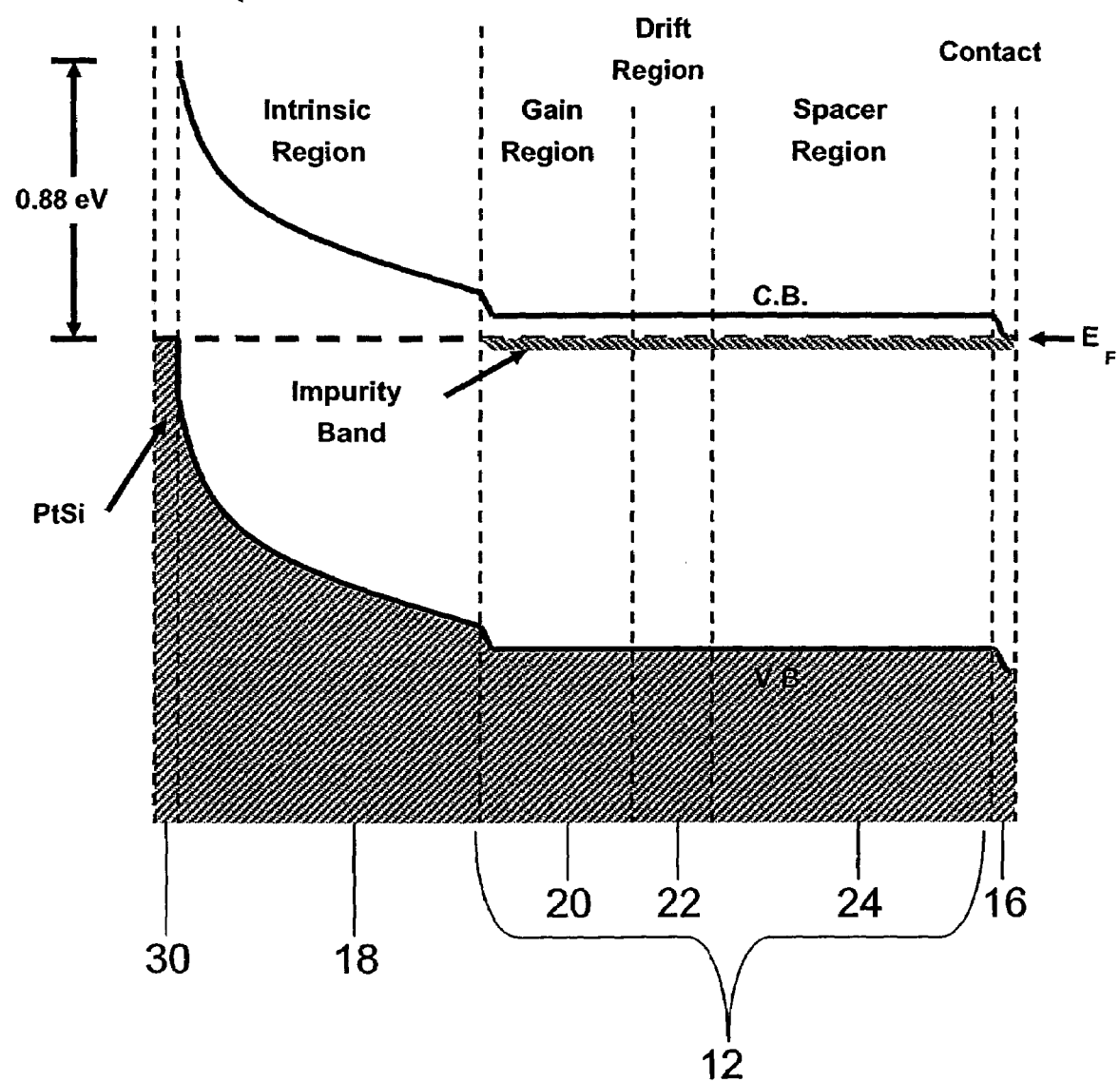

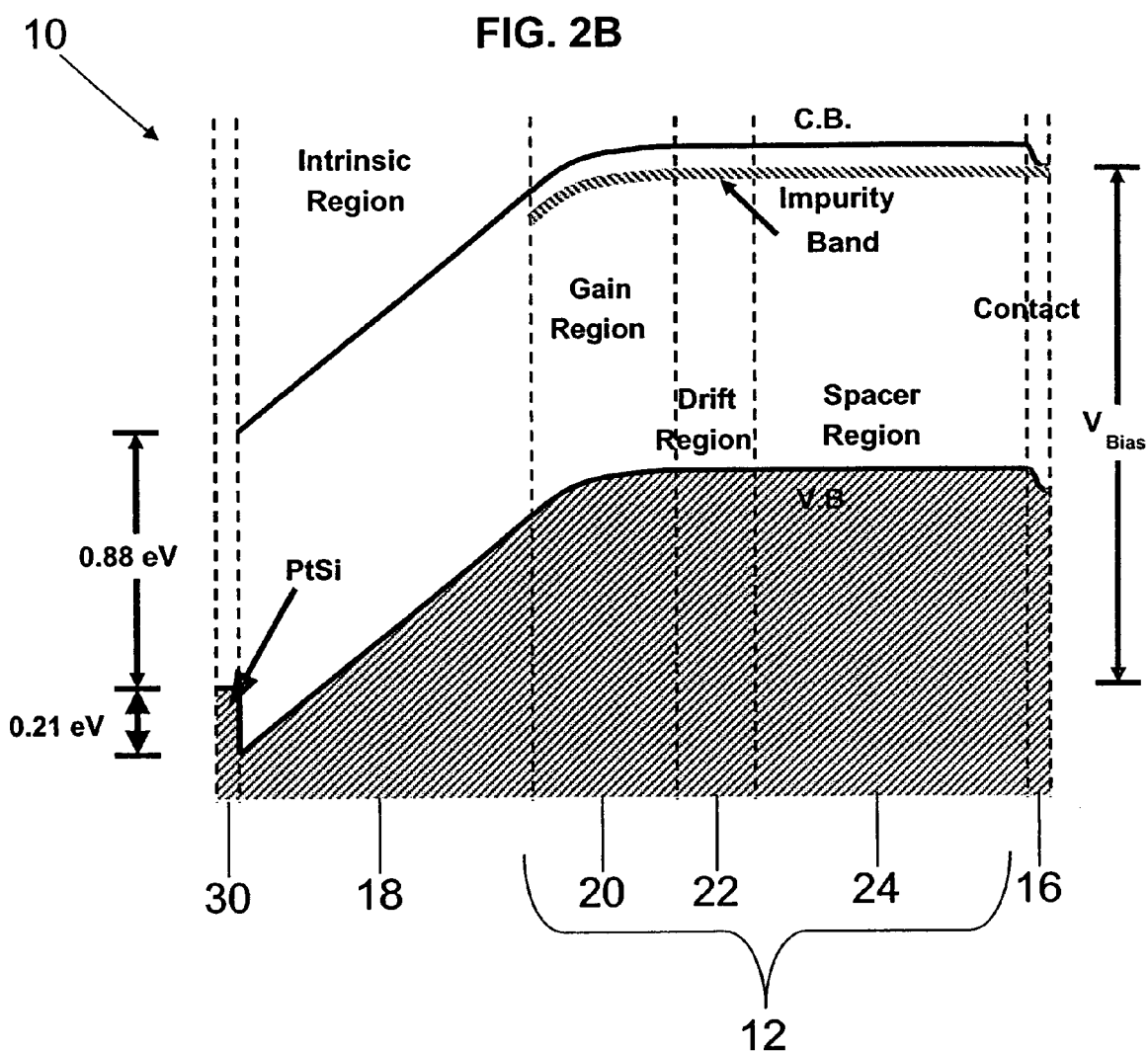

PRIOR ART

PRIOR ART

NEAR-INFRARED VISIBLE LIGHT PHOTON COUNTER

CROSS REFERENCE TO RELATED APPLICATION

This application claims the benefit of U.S. Provisional Application No. 60/496,856 filed Aug. 21, 2003, assigned to the assignee of this application and incorporated by reference herein.

FIELD OF THE INVENTION

The present invention relates generally to detection of electromagnetic radiation and, more particularly, to detectors capable of detecting individual photons in the spectral range having wavelengths of about 1–2 microns.

BACKGROUND OF THE INVENTION

Very high speed photon counting detectors are needed for numerous applications in optical communications, imaging LADAR, quantum cryptography, high-energy physics, spectroscopy, quantum computing and the like. Prior art photon detectors, such as a Visible Light Photon Counter ("VLPC"), see U.S. Pat. No. 4,962,304 incorporated by reference herein, and the closely related Solid-State Photomultiplier ("SSPM"), see U.S. Pat. No. 4,586,068 incorporated by reference herein, have high quantum efficiency ("QE") and low pulse height dispersion, such that these detectors can operate in the "number mode" to determine the number of photons detected at the detector over very short time intervals. These photon counting detectors are distinguishable from prior art detectors containing a photon counting Avalanche Photodiode ("APD"), see H. Dautet, P. Deschamps, B. Dion, A. D. MacGregor, D. MacSween, R. J. McIntyre, C. Trottier, and P. P. Webb, *Photon Counting Techniques With Silicon Avalanche Photodiodes*, Appl. Opt. 32, 3894 (1993), incorporated by reference herein, which has a lower QE and larger pulse height dispersion relative to that of a VLPC and SSPM. In an APD detector, "Geiger mode" counting operation occurs in that photons incident upon the detector trigger an avalanche current and the avalanche current is measured over a relatively long reset interval, such as 35 ns, to generate a photon count.

In a typical prior art VLPC, the intrinsic absorption of silicon, from which the intrinsic impurity band detector is formed, provides relatively high quantum efficiency for photon counting in the spectral range having wavelengths of about 0.4–1.0 microns. In a typical prior art SSPM, arsenic doping of silicon provides for extrinsic absorption that achieves high quantum efficiency in the infrared spectral range having wavelengths of about 2–28 microns.

Thus, although the VLPC and SSPM devices are high speed photon counting devices, each has low light absorption in the spectral region having wavelengths of about 1–2 microns, which results in low quantum efficiency in such spectral region. Many excellent light sources and desired applications for high speed photon counting, however, exist for the spectral range having wavelengths of about 1–2 microns.

Therefore, a need exists for a high speed photon counting detector for detecting photons in the spectral range having wavelengths of about 1–2 microns.

SUMMARY OF THE INVENTION

In accordance with the present invention, a very high speed photon counting detector with high QE in the spectral band having wavelengths of about 1–2 microns includes an intrinsic semiconducting region (or "blocking region") that couples an absorber layer having high quantum efficiency in a spectral range having wavelengths of about 1–2 microns to an extrinsic semiconducting region (or "impurity band region"). The intrinsic semiconducting region is provided with first and second conductivity type impurity concentrations which are low enough that substantially no charge transport occurs by an impurity conduction mechanism. The extrinsic semiconducting region has a first conductivity type impurity concentration which is high enough to allow charge transport by impurity to impurity hopping conduction. The extrinsic semiconducting region is also coupled to an electrical contact. The absorber layer functions as the second electrical contact. Depending on whether the intrinsic and extrinsic semiconducting regions are n-type or p-type, the absorber layer, upon illumination by energy having wavelengths at about 1–2 microns, photoemits primary carriers in the form of hot holes or hot electrons, respectively, with high efficiency into the blocking region. With the application of a suitable bias across the blocking and impurity band regions, the hot holes or hot electrons accelerate in the extrinsic region to attain an energy sufficient to impact ionize the impurities, which preferably include Arsenic dopants in the case of n-type devices or Gallium dopants in the case of p-type devices, to initiate avalanche multiplication. The absorber layer, which constitutes one of the electrical contacts of the detector, is used in combination with the electrical contact coupled to the impurity band region to measure the avalanche current. Based on the measured avalanche current, a count of the number of photons incident upon the detector over a relatively short time interval, such as 1 ns, can be obtained.

BRIEF DESCRIPTION OF THE DRAWINGS

Other objects and advantages of the present invention will be apparent from the following detailed description of the presently preferred embodiments, which description should be considered in conjunction with the accompanying drawings in which like references indicate similar elements and in which:

FIG. 1 is a cross-sectional schematic view of a high speed photon counting detector for detecting radiation with high efficiency in a spectral range having wavelengths of about 1–2 microns in accordance with the present invention.

FIG. 2A is an energy band diagram of the detector of FIG. 1.

FIG. 2B is an energy band diagram of the detector of FIG. 1 under bias.

DETAILED DESCRIPTION OF THE INVENTION

Figure 3A:
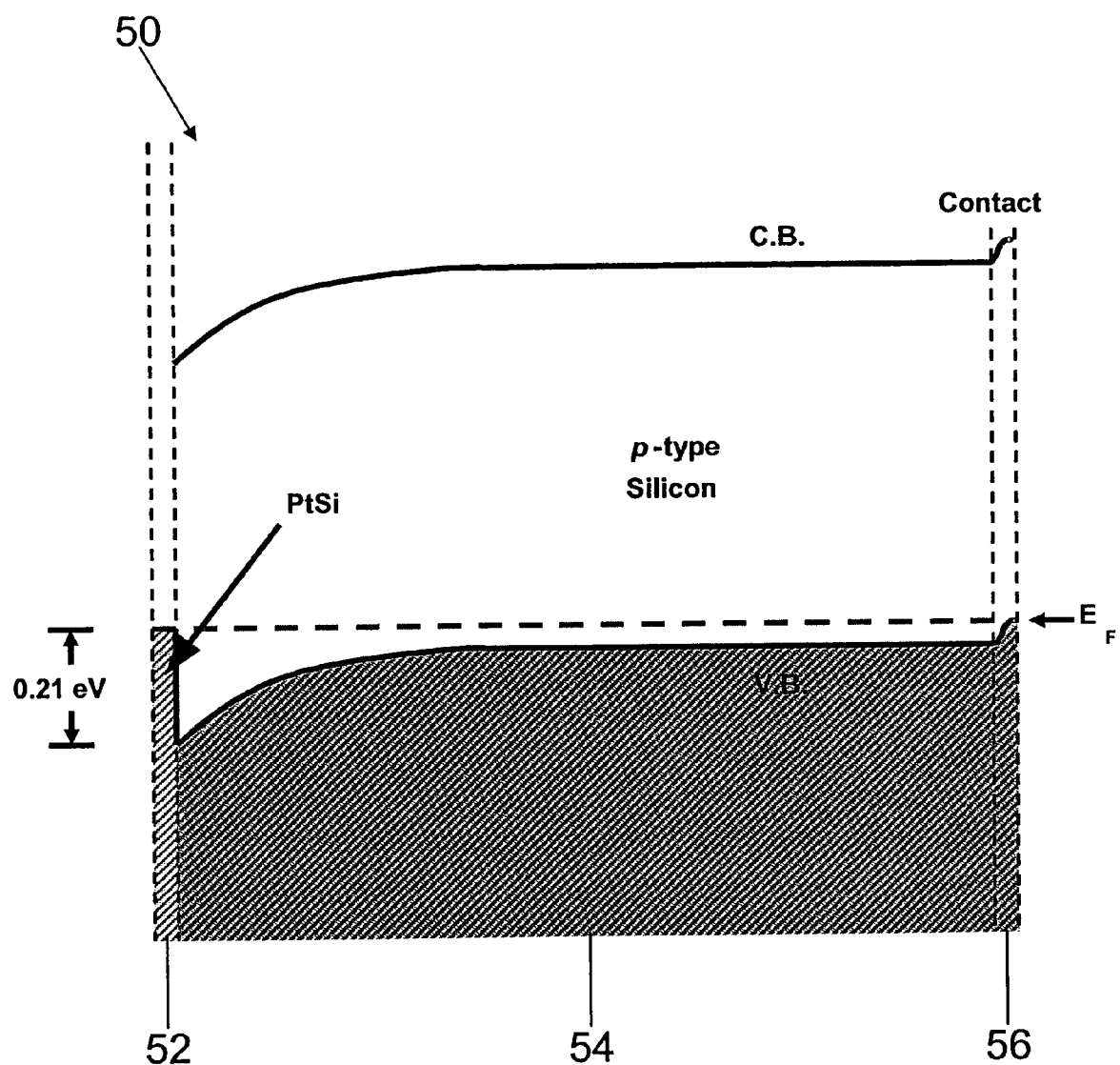
FIG. 3A is an energy band diagram of a prior art PtSi p-type silicon photodetector.

The inventive high speed photon counting detector is an impurity band conduction semiconducting device that uses extrinsic generation of photocarriers for photon detection of electromagnetic energy and includes an absorber layer having high quantum efficiency in the spectral range having wavelengths of about 1–2 microns which is coupled to the impurity band conduction device to allow photon counting in the spectral range having wavelengths of about 1–2 microns. For purposes of illustration, the invention is described in detail below in connection with an impurity band conduction semiconducting device configured as an intrinsic impurity band detector and commonly known as a Visible Light Photon Counter ("VLPC"), described in U.S. Pat. No. 4,962,304, incorporated by reference herein. It is to be understood, however, that the present invention of coupling an absorber layer to an impurity band conduction semiconducting device can be applied to other impurity band conduction devices, such as a solid state photomultiplier ("SSPM") photon detector described in U.S. Pat. No. 4,586,068, incorporated by reference herein. A detailed description of the construction and operation of the impurity band conduction detector structure used to illustrate preferred embodiments of the present invention is found in U.S. Pat. Nos. 4,962,304 and 4,568,068.

FIG. 1 is a cross-sectional view of a high speed photon counting detector (or VLPC detector) 10, in accordance with the present invention, that operates with quantum high efficiency in a spectral range having wavelengths between about 1–2 microns. The semiconducting material from which the VLPC detector 10 is formed can include, for example, silicon or germanium. In the preferred exemplary embodiment, the VLPC detector 10 is made of n-type semiconducting material. Referring to FIG. 1, the detector 10 includes an extrinsic impurity band semiconductor layer 12 deposited over a substrate 14. A contact layer 16 is interposed between the layer 12 and the substrate 14. An intrinsic semiconducting blocking layer 18 is deposited on the impurity band layer 12, which includes impurity band conduction sublayers 20, 22 and 24 corresponding respectively to gain, drift and spacer regions for tailoring of device characteristics, as is well known in the art. The impurity band layer 12 is provided with a first conductivity type impurity concentration, such as Arsenic doping, high enough to create an impurity energy band. The blocking layer 18 contains first and second conductivity type impurity concentrations which are both low enough that substantially no charge transport can occur in the blocking layer by an impurity band conduction mechanism.

In accordance with the present invention, an absorber layer 30 overlays, or preferably is formed on, the blocking layer 18. The absorber layer 30 has high quantum efficiency in the spectral range having wavelengths of about 1–2 microns. In a preferred embodiment, the absorber layer 30 comprises a thin film of PtSi. In other preferred embodiments, the absorber layer 30 includes hetero-structures with other semiconductor materials, such as GaAs, InAs, InSb or SiGe alloys; thin metal layers; or silicide layers. The applicants have discovered that applying such an absorber layer onto a doped n-type semiconductor, which is not conventional in the semiconducting prior art involving such an absorbing layer, provides photo-excited carriers corresponding to selected wavelengths of electromagnetic energy detected at the absorber layer, namely, wavelengths of about 1–2 microns, which can be injected into the blocking layer of an impurity band semiconducting device, such as a VLPC. In conventional operation of a VLPC to perform high speed photon counting, the VLPC, which is normally a n-type characteristic material at room temperature, is operated at low temperature to minimize dark currents and noise, which cause background counts unrelated to photon-induced counts. The applicants have recognized that, at low temperatures, the n-type VLPC takes on p-type semiconducting material characteristics. Consequently, in view of such low temperature operating conditions, the present invention modifies the VLPC to include PtSi or like absorber materials, which have high QE at wavelengths of about 1–2 microns and which normally are applied to p-type materials and not to materials considered to be n-type at room temperature, such as conventional, known VLPC detectors.

FIG. 2A illustrates the band structure of the detector 10 at zero bias and low temperature. The detector 10 is operated at low temperature, such as at about 6–7° K, so that there is insufficient thermal energy to excite donor electrons, which are associated with the impurities in the gain region 20, into the conduction band. In the preferred exemplary embodiment of the detector 10 made from the silicon, the silicon layers of the VLPC structure, namely, the layers 18 and 12, are all n-type. This band structure differs from the typical prior art PtSi Schottky barrier silicon photodetector 50, as shown in FIG. 3A, which includes an absorber layer 52 of PtSi coupled to a p-type silicon semiconducting layer 54 that overlays a contact layer 56. On the n-type silicon VPLC, the Schottky barrier is about 0.88 eV, as shown in FIG. 2A, whereas on p-type silicon in the photodetector 50, the Schottky barrier is about 0.21 eV, as shown in FIG. 3A.

Figure 3B:
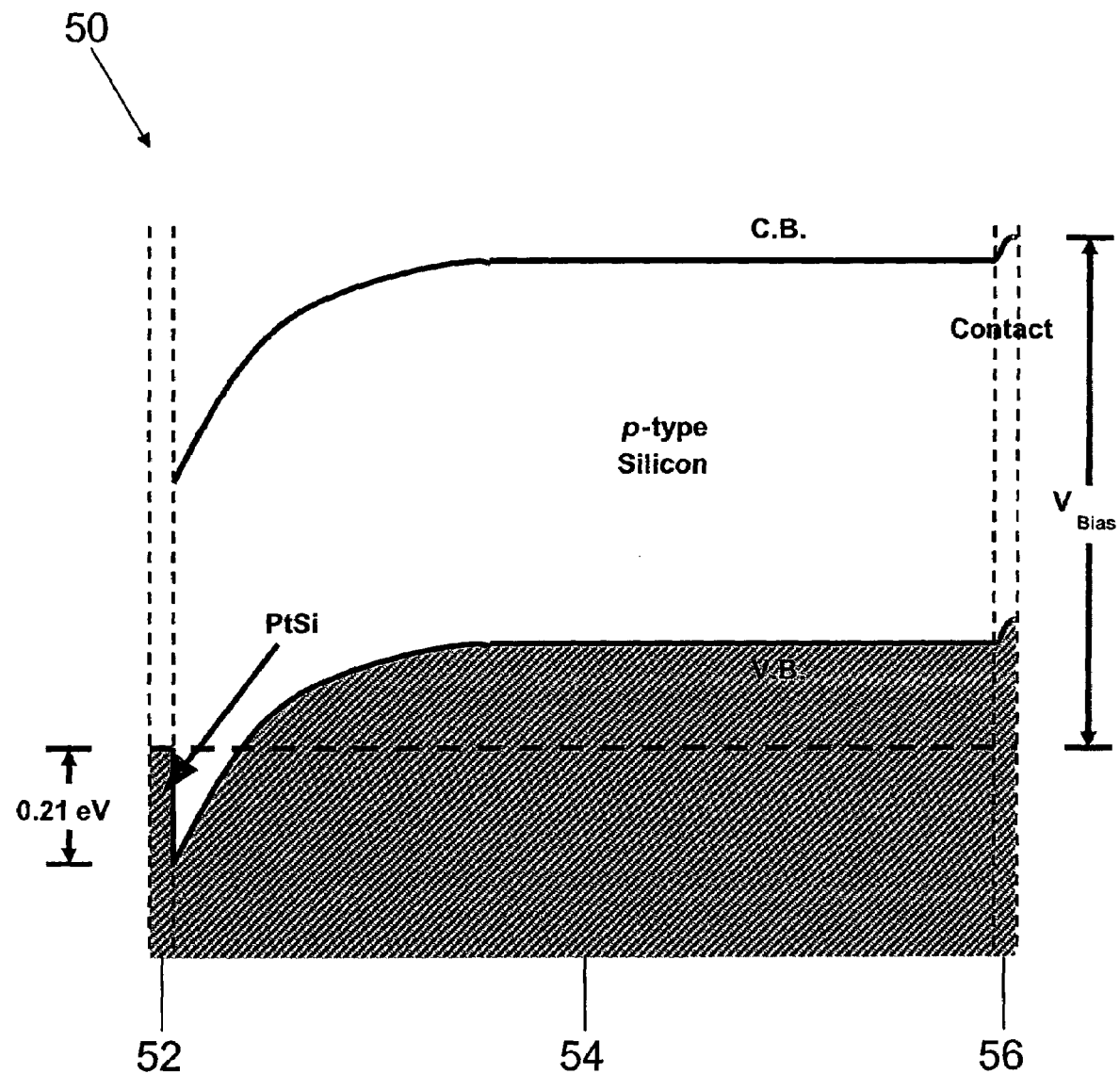
FIG. 3B is an energy band diagram of the prior art PtSi photodetector of FIG. 3A under bias.
Figure 4:
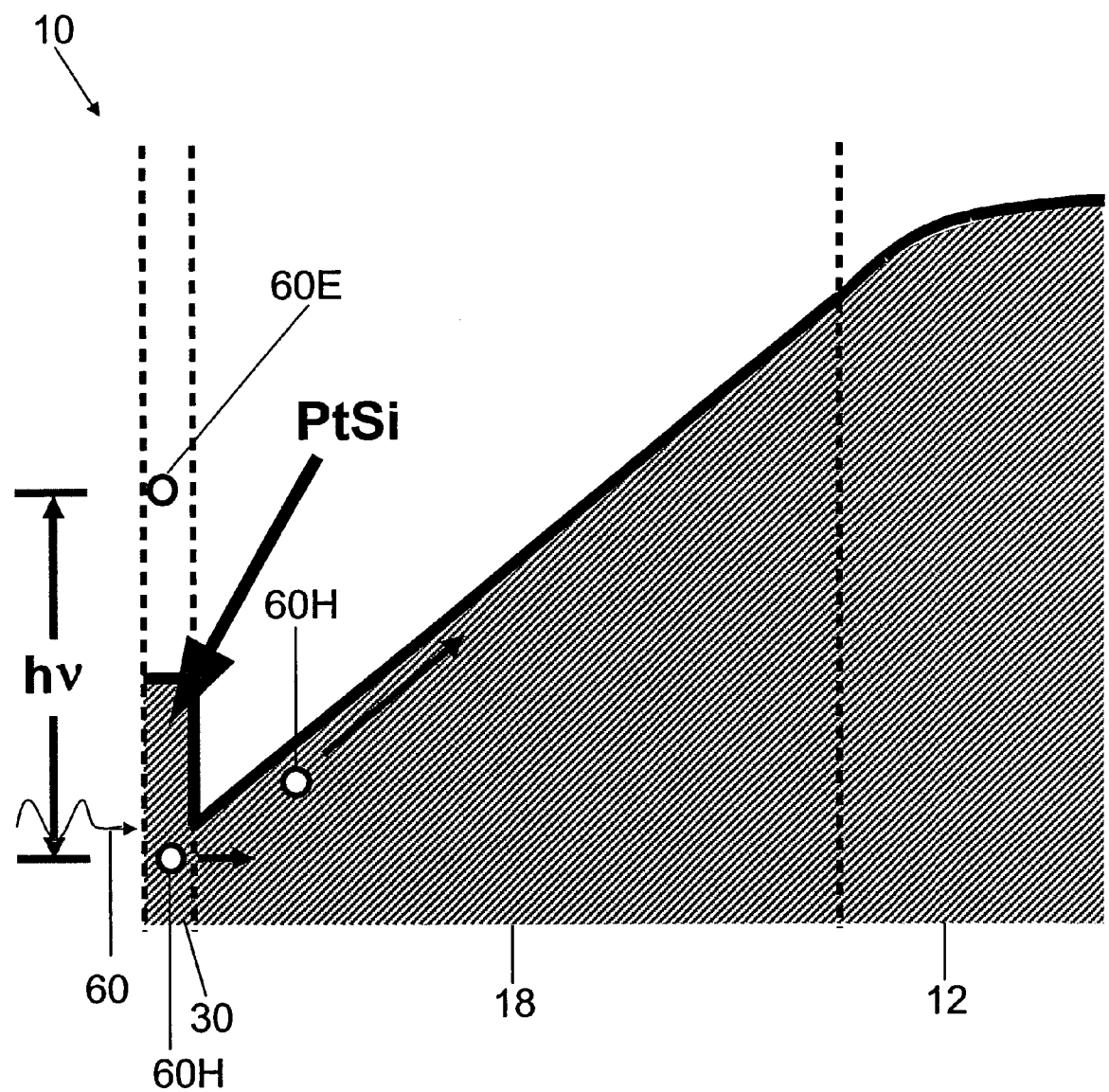
FIG. 4 is an energy band diagram of the detector of FIG. 1 showing absorption of a photon in the absorber layer.

In accordance with the present invention, the detector 10 is operated with a bias about 7 volts between the first contact, which the absorber layer 30 constitutes, and the second contact, which the contact layer 16 constitutes, so that the Schottky barrier diode in the detector 10 structure is forward biased, as shown in FIG. 2B. In contrast, the prior art PtSi photodetector 50 is usually operated with a small reverse bias, such as about 0.5 V as shown in FIG. 3B, which has the same polarity (i.e. positive on the PtSi absorber layer 52) as the bias needed on the detector 10. In operation of the detector 10, photons having wavelengths of about 1–2 microns, which are weakly absorbed by the Arsenic dopant atoms in the silicon of the VLPC detector 10 because the VLPC structure has a low level of quantum efficiency in such spectral range, are strongly absorbed in the absorber layer 30 because the layer 30 has a high level of quantum efficiency in such spectral range. The absorber layer 30 detects photons by the process of internal photoemission. As shown in FIG. 4, absorption of a photon 60 in the absorber layer 30 generates an energetic electron-hole pair. The hole 60H of the pair 60H and 60E, which has an energy measured from the Fermi surface downward, has a large probability of having sufficient energy to surmount the potential barrier of the PtSi-to-silicon Schottky barrier. Upon injection of the "hot" or energized hole 60H into the silicon layer 18, the hole 60H drifts under the influence of the applied bias to initiate an avalanche across the impurity band region 12 as is well known in the art for a VLPC detector, such as described in detail in G. B. Turner et al., *Visible Light Photon Counters for Scintillating Fiber Applications: I. Characteristics and Performance* and M. G. Stapelbroek and M. D. Petroff, *Visible Light Photon Counters for Scintillating Fiber Applications: II. Principles of Operation*, both in SCIFI93 Workshop on Scintillating Fiber Detectors, Notre Dame, Ind., Oct. 24–28, 1993 (World Scientific, River Edge, N.J., 1995), incorporated by reference herein. The injection of hot holes into silicon also is well known in the art. See A. Czernik et al., *Infrared Photoemission of Holes from Ultrathin (3–20 nm) Pt/Ir-Compound Silicide Films into Silicon*, Appl. Phys. A 55, 180 (1992), incorporated by reference herein.

The efficiency of the internal photoemission process is very energy (wavelength) dependent. The quantum efficiency of the process is usually described by a modified Fowler equation, $$\eta = C_1 \frac{(h\upsilon - q\phi_b)^2}{h\upsilon} = 1.24 \frac{C_1}{\lambda}\left(1 - \frac{\lambda}{\lambda_c}\right), \quad (1)$$

where $\phi_b$ is the potential barrier (0.21 eV), q is the electron charge, hv is the photon energy, $C_1$ is the Fowler emission coefficient, $\lambda_c$ is the cutoff wavelength in microns (1.24/$q\phi_b$) and $\lambda$ is in microns. Measured values of $C_1$ for PtSi on silicon are about 0.2 $eV^{-1}$, so that the quantum efficiency at a wavelength of about 1.06 microns is predicted to be around 20%.

It is known that carriers that are thermally excited over the potential barrier will also cause avalanches and, therefore, generate dark counts. Dark current density from carriers thermally exited over the barrier is described by the Richardson equation $$J_d = A_r T^2 \exp\left(-\frac{q\phi_b}{kT}\right), \quad (2)$$

where $A_r$ is Richardson's constant, k is Boltzmann's constant, and T is the absolute temperature. For the VLPC operating temperature below 10° K, the exponential term is of order $10^{-100}$, so the dark count rate due to thermally excited carriers should be negligible.

In a further preferred embodiment, optical absorption and emission efficiency in the inventive detector 10 may be optimized by forming an optical cavity that is one quarter wavelength in thickness on top of the absorber layer 30 and where a reflecting layer is the top layer of the detector. See, for example, H. Elabd and W. F. Kosonocky, *Theory and Measurements of Photoresponse for Thin Film Pd2Si and PtSi Infrared Schottky-Barrier Detectors With Optical Cavity*, RCA Rev. 43, 569 (1982), incorporated by reference herein, which describes forming optical cavities for PtSi photodetector arrays.

In a another preferred embodiment, the absorber layer 30 and the blocking layer 18 are configured in the form of a groove, such as described in U.S. Pat. No. 5,285,098, incorporated by reference herein, where the absorber layer 30 is formed in each groove over the semiconducting blocking layer 18.

Although preferred embodiments of the present invention have been described and illustrated, it will be apparent to those skilled in the art that various modifications may be made without departing from the principles of the invention.

What is claimed is:

1. A solid state photon counting detector comprising:
    an absorber layer having high quantum efficiency in a spectral range having wavelengths between about 1 micron and about 2 microns;
    an intrinsic semiconducting blocking layer coupled to the absorber layer and to an extrinsic impurity band semiconducting region, wherein the blocking layer is provided with first and second conductivity type impurity concentrations which are low enough that substantially no charge transport occurs by an impurity conduction mechanism, wherein the impudty band region has a first conductivity type impurity concentration which is high enough to create an impurity gain band region, wherein the impurity band region further includes a drift region; and
    a contact layer coupling the drift region to a substrate.

2. The detector of claim 1, wherein the absorber layer includes at least one of PtSi, GaAs, InAs, InSb and SiGe alloys.

3. The detector of claim 1, wherein the absorber layer is made of metal materials.

4. The detector of claim 1, wherein the absorber layer includes suicide materials.

5. The detector of claim 1, wherein the impurity band region further includes a spacer region, wherein the spacer region is interposed between the contact layer and the drift region.

* * * * *